United States Patent
Roldan et al.

(10) Patent No.: US 9,729,170 B1
(45) Date of Patent: Aug. 8, 2017

(54) ENCODING SCHEME FOR PROCESSING PULSE-AMPLITUDE MODULATED (PAM) SIGNALS

(71) Applicant: Xilinx, Inc., San Jose, CA (US)

(72) Inventors: Arianne B. Roldan, Singapore (SG); Hsung Jai Im, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/193,635

(22) Filed: Jun. 27, 2016

(51) Int. Cl.
*H03M 9/00* (2006.01)
*H04L 27/04* (2006.01)

(52) U.S. Cl.
CPC ............... *H03M 9/00* (2013.01); *H04L 27/04* (2013.01)

(58) Field of Classification Search
CPC .................................. H03M 9/00; H04L 27/04
USPC ......................................................... 341/100
See application file for complete search history.

(56) References Cited

U.S. PATENT DOCUMENTS

| | | | | |
|---|---|---|---|---|
| 5,805,088 A | * | 9/1998 | Butter ..................... | H03M 9/00 341/100 |
| 6,788,236 B2 | * | 9/2004 | Erdogan ............ | H03H 17/0288 341/143 |
| 6,819,616 B2 | * | 11/2004 | La ........................ | G11C 7/1066 365/219 |
| 8,188,894 B2 | * | 5/2012 | Chin ....................... | H03M 9/00 341/100 |

* cited by examiner

*Primary Examiner* — Brian Young
(74) *Attorney, Agent, or Firm* — David O'Brien

(57) ABSTRACT

An integrated circuit (IC) includes a serial-to-parallel converter configured to receive a serial input signal to provide one or more parallel output signals. The serial input signal is an M-level Pulse-Amplitude Modulated (PAM) signal, wherein M is a positive integer. The serial-to-parallel converter includes a data converter configured to receive the serial input signal and provide a data converter output signal. The data converter output signal represents information of the serial input signal with N1 bits, and N1 is a positive integer. An encoder is configured to encode the data converter output signal to provide encoder output signal with N2 bits, wherein N2 is a positive integer less than half of N1. One or more sub-deserializers are configured to receive the encoder output signal and generate the one or more parallel output signals.

20 Claims, 10 Drawing Sheets

200 ⟶

| $V_{in}$ | Data Slicer(s) Output | | |
|---|---|---|---|
| | DH | DZ | DL |
| $V_{in} < V_{th,DL}$ | 0 | 0 | 0 |
| $V_{th,DL} < V_{in} < V_{th,DZ}$ | 0 | 0 | 1 |
| $V_{th,DZ} < V_{in} < V_{th,DH}$ | 0 | 1 | 1 |
| $V_{th,DH} < V_{in}$ | 1 | 1 | 1 |

| $V_{in}$ | Error Slicer(s) Output | | | |
|---|---|---|---|---|
| | EHP | ELP | EHN | ELN |
| $V_{in} < V_{th,ELN}$ | 0 | 0 | 0 | 0 |
| $V_{th,ELN} < V_{in} < V_{th,EHN}$ | 0 | 0 | 0 | 1 |
| $V_{th,EHN} < V_{in} < V_{th,ELP}$ | 0 | 0 | 1 | 1 |
| $V_{th,ELP} < V_{in} < V_{th,EHP}$ | 0 | 1 | 1 | 1 |
| $V_{th,EHP} < V_{in}$ | 1 | 1 | 1 | 1 |

FIG. 2C

Data Encoder Input | | | | Data Encoder Output |

| DH | DZ | DL | D1 | D0 |
|----|----|----|----|----|
| 0  | 0  | 0  | 0  | 0  |
| 0  | 0  | 1  | 0  | 1  |
| 0  | 1  | 1  | 1  | 0  |
| 1  | 1  | 1  | 1  | 1  |

Error Encoder Input | | | | Error Encoder Output | |

| EHP | ELP | EHN | ELN | E2 | E1 | E0 |
|-----|-----|-----|-----|----|----|----|
| 0   | 0   | 0   | 0   | 0  | 0  | 0  |
| 0   | 0   | 0   | 1   | 0  | 0  | 1  |
| 0   | 1   | 1   | 1   | 0  | 1  | 0  |
| 1   | 1   | 1   | 1   | 1  | 1  | 1  |
| X   | X   | X   | X   | 1  | 0  | 0  |
| X   | X   | X   | X   | 1  | 1  | 0  |
| X   | X   | X   | X   | 1  | 1  | 1  |

| | Mixed Encoder Input | | | | | | | Mixed Encoder Output | | | Notes |
|---|---|---|---|---|---|---|---|---|---|---|---|
| | EHP | DH | ELP | DZ | EHN | DL | ELN | D1 | D0 | DE | DE Equiv |
| 502 → | 0 | 0 | 0 | 0 | 0 | 0 | 0 | 0 | 0 | 0 | ELN |
| 504 → | 0 | 0 | 0 | 0 | 0 | 0 | 1 | 0 | 0 | 1 | ELN |
| 506 → | 0 | 0 | 0 | 0 | 1 | 1 | 1 | 0 | 1 | 0 | EHN |
| 508 → | 0 | 0 | 0 | 1 | 1 | 1 | 1 | 0 | 1 | 1 | EHN |
| 510 → | 0 | 0 | 1 | 1 | 1 | 1 | 1 | 1 | 0 | 0 | ELP |
| 512 → | 0 | 1 | 1 | 1 | 1 | 1 | 1 | 1 | 0 | 1 | ELP |
| 514 → | 0 | 1 | 1 | 1 | 1 | 1 | 1 | 1 | 1 | 0 | EHP |
| 516 → | 1 | 1 | 1 | 1 | 1 | 1 | 1 | 1 | 1 | 1 | EHP |

| Mixed Encoder Input | | | Mixed Encoder Output | | |
|---|---|---|---|---|---|
| DH | DZ | DL | D1 | D0 | DE |
| 0 | 0 | 0 | 0 | 0 | ELN |
| 0 | 0 | 1 | 0 | 1 | ELP |
| 0 | 1 | 1 | 1 | 0 | EHN |
| 1 | 1 | 1 | 1 | 1 | EHP |

| Mixed Encoder Input | | | | | | | | | | | Mixed Encoder Output | | | | | |
|---|---|---|---|---|---|---|---|---|---|---|---|---|---|---|---|---|
| 11-bit Data | | | | | | | | | | | 4-bit Data | | | | | Notes |
| EHP2 | EHN2 | EHP | EH | ELP | EL | EHN | EL | ELN | EL2 | ELN2 | D3 | D2 | D1 | D0 | DE | DE Equiv |
| 0 | 0 | 0 | 0 | 0 | 0 | 0 | 0 | 0 | 0 | 0 | 0 | 0 | 0 | 0 | 0 | DE Equiv |
| 0 | 0 | 0 | 0 | 0 | 0 | 0 | 0 | 0 | 0 | 1 | 0 | 0 | 0 | 0 | 1 | ELN2 |
| 0 | 0 | 0 | 0 | 0 | 0 | 0 | 0 | 1 | 1 | 1 | 0 | 0 | 0 | 1 | 0 | ELN2 |
| 0 | 0 | 0 | 0 | 0 | 0 | 0 | 1 | 1 | 1 | 1 | 0 | 0 | 1 | 1 | 0 | ELN |
| 0 | 0 | 0 | 0 | 0 | 0 | 1 | 1 | 1 | 1 | 1 | 0 | 0 | 1 | 1 | 1 | ELN |
| 0 | 0 | 0 | 0 | 0 | 1 | 1 | 1 | 1 | 1 | 1 | 0 | 1 | 0 | 0 | 0 | EHN3 |
| 0 | 0 | 0 | 0 | 1 | 1 | 1 | 1 | 1 | 1 | 1 | 0 | 1 | 1 | 0 | 1 | EHN3 |
| 0 | 0 | 0 | 1 | 1 | 1 | 1 | 1 | 1 | 1 | 1 | 0 | 1 | 1 | 1 | 0 | ELP |
| 0 | 0 | 1 | 1 | 1 | 1 | 1 | 1 | 1 | 1 | 1 | 0 | 1 | 1 | 1 | 1 | ELP |
| 0 | 1 | 1 | 1 | 1 | 1 | 1 | 1 | 1 | 1 | 1 | 1 | 0 | 0 | 0 | 0 | EHP |
| 0 | 1 | 1 | 1 | 1 | 1 | 1 | 1 | 1 | 1 | 1 | 1 | 1 | 0 | 1 | 1 | EHP |
| 1 | 1 | 1 | 1 | 1 | 1 | 1 | 1 | 1 | 1 | 1 | 1 | 1 | 1 | 1 | 0 | EHP2 |
| 1 | 1 | 1 | 1 | 1 | 1 | 1 | 1 | 1 | 1 | 1 | 1 | 1 | 1 | 1 | 1 | EHP2 |

900

ENCODING SCHEME FOR PROCESSING PULSE-AMPLITUDE MODULATED (PAM) SIGNALS

FIELD

Examples of the present disclosure generally relate to integrated circuits ("ICs") and, in particular, to an embodiment related to data reception using an encoding scheme for PAM signals in ICs.

BACKGROUND

In a conventional serializer/deserializer (SerDes) link, a serializer is able to generate a serialized signal for transmission across a channel between a transmitter and a receiver. As a signal is transmitted across the channel, an encoding scheme including transmit symbols is employed. An example of an encoding scheme is a 2-level PAM (PAM-2) scheme, which is referred to as non-return-to-zero or NRZ. For the NRZ scheme, the transmit symbols have normalized signal levels of +1 and −1, which may be represented using a single bit. As data rates increase to meet demand for higher data throughput, multi-bit symbols based on various encoding schemes (e.g., PAM-4) may be used. For the PAM-4 scheme, a transmit symbol may have one of four different values (with normalized signal levels of −3, −1, +1, and +3). While using multi-bit symbols based on encoding schemes such as PAM-4 may increase data rates and bandwidth efficiency, at the receiver side, those multi-bit symbols may require using more power and area in data processing.

Accordingly, it would be desirable and useful to provide an improved way of handling multi-bit symbols based on various encoding schemes (e.g., PAM-4).

SUMMARY

In some embodiments in accordance with the present disclosure, an integrated circuit (IC) includes a serial-to-parallel converter configured to receive a serial input signal to provide one or more parallel output signals, wherein the serial input signal is an M-level Pulse-Amplitude Modulated (PAM) signal, wherein M is a positive integer. The serial-to-parallel converter includes a data converter configured to receive the serial input signal, and provide a data converter output signal. The data converter output signal represents information of the serial input signal with N1 bits, wherein N1 is a positive integer. An encoder is configured to encode the data converter output signal to provide encoder output signal with N2 bits, wherein N2 is a positive integer less than half of N1. One or more sub-deserializers are configured to receive the encoder output signal and generate the one or more parallel output signals.

In some embodiments, the data converter is configured to represent data information of the serial input signal using a first number of bits of the data converter output signal; and represent error information of the serial input signal using a second number of bits of the data converter output signal, wherein the second number is greater than the first number.

In some embodiments, the encoder is configured to represent data information of the serial input signal using a third number of parallel bits of the encoder output signal; and represent data information of the serial input signal using a fourth number of parallel bits of the encoder output signal, wherein the fourth number is less than the third number.

In some embodiments, the serial input signal is a PAM-4 signal, where M equals to four, N1 equals to seven, and N2 equals to three.

In some embodiments, wherein the first number equals to three, the second number equals to four, the third number equals to two, and the fourth number equals to one.

In some embodiments, the one or more parallel output signals includes a data output signal representing the data information of the serial input signal and an error output signal representing the error information of the serial input signal. A first ratio of a number of parallel bits of the data output signal to a number of parallel bits of the error output signal is the same as a second ration of the third number to the fourth number.

In some embodiments, the data converter includes even slicers configured to provide an even data converter output signal, wherein the even data converter output signal represents information of the serial input signal in an even data path, and odd slicers configured to provide an odd data converter output signal, wherein the odd data converter output signal represents information of the serial input signal in an odd data path.

In some embodiments, the data converter includes an even encoder configured to receive the even data converted output signal; provide a data even encoder output signal representing data information of the serial input signal in the even data path; and provide an error even encoder output signal representing error information of the serial input signal in the even data path. The data converter further includes an odd encoder configured to receive the odd data converted output signal provide a data odd encoder output signal representing data information of the serial input signal in the odd data path; and provide an error odd encoder output signal representing error information of the serial input signal in the odd data path.

In some embodiments, the IC includes a first sub-deserializer and a second sub-deserializer clocked by a first clock. The first sub-deserializer is configured to receive the data even encoder output signal and the error even encoder output signal; provide a first sub-deserializer output signal representing the data information in the even data path; and provide a second sub-deserializer output signal representing the error information in the even data path. The second sub-deserializer is configured to receive the data odd encoder output signal and the error odd encoder output signal; provide a third sub-deserializer output signal representing the data information in the odd data path; and provide a fourth sub-deserializer output signal representing the error information in the odd data path.

In some embodiments, the IC includes a third sub-deserializer and a fourth sub-deserializer clocked by a second clock having a clock cycle greater than that of the first clock. The third sub-deserializer is configured to receive the first sub-deserializer output signal of the first sub-deserializer and the third sub-deserializer output signal of the second sub-deserializer; and provide a fifth sub-deserializer output signal representing the data information of the serial input signal. The fourth sub-deserializer is configured to receive the second sub-deserializer output signal of the first sub-deserializer and the fourth sub-deserializer output signal of the second sub-deserializer; and provide a sixth sub-deserializer output signal representing the error information of the serial input signal.

In some embodiments in accordance with the present disclosure, a method includes receiving a serial input signal, wherein the serial input signal is an M-level Pulse-Amplitude Modulated (PAM) signal, wherein M is a positive integer; providing a data converter output signal representing information of the serial input signal with N1 bits, wherein N1 is a positive integer; encoding the data converter output signal to provide an encoder output signal with N2 bits, wherein N2 is a positive integer less than half of N1; and expanding parallel bits of the encoder output signal to provide one or more parallel output signals.

In some embodiments, the providing a data converter output signal representing information of the serial input signal includes representing data information of the serial input signal using a first number of bits of the data converter output signal; and representing error information of the serial input signal using a second number of bits of the data converter output signal, wherein the second number is greater than the first number.

In some embodiments, the encoding the data converter output signal to provide an encoder output includes representing data information of the serial input signal using a third number of parallel bits of the encoder output signal; and representing data information of the serial input signal using a fourth number of parallel bits of the encoder output signal, wherein the fourth number is less than the third number.

In some embodiments, the providing the data converter output signal representing information of the serial input signal includes providing an even data converter output signal, wherein the even data converter output signal represents information of the serial input signal in an even data path; and providing an odd data converter output signal, wherein the odd data converter output signal represents information of the serial input signal in an odd data path.

In some embodiments, the method includes encoding the even data converted output signal to provide a data even encoder output signal representing data information of the serial input signal in the even data path; and provide an error even encoder output signal representing error information of the serial input signal in the even data path; and encoding the odd data converted output signal to provide a data odd encoder output signal representing data information of the serial input signal in the odd data path; and provide an error odd encoder output signal representing error information of the serial input signal in the odd data path.

In some embodiments, the method includes clocking a first sub-deserializer and a second sub-deserializer clocked using a first clock; sending the data even encoder output signal and the error even encoder output signal to a first sub-deserializer; providing a first sub-deserializer output signal representing the data information in the even data path; and providing a second sub-deserializer output signal representing the error information in the even data path; and sending the data odd encoder output signal and the error odd encoder output signal; providing a third sub-deserializer output signal representing the data information in the odd data path; and providing a fourth sub-deserializer output signal representing the error information in the odd data path.

In some embodiments, the method includes clocking a third sub-deserializer and a fourth sub-deserializer clocked by a second clock having a clock cycle greater than that of the first clock; sending the first sub-deserializer output signal of the first sub-deserializer and the third sub-deserializer output signal of the second sub-deserializer to the third sub-deserializer; providing a fifth sub-deserializer output signal representing the data information of the serial input signal; and sending the second sub-deserializer output signal of the first sub-deserializer and the fourth sub-deserializer output signal of the second sub-deserializer to the fourth sub-deserializer; and providing a sixth sub-deserializer output signal representing the error information of the serial input signal.

Other aspects and features will be evident from reading the following detailed description and accompanying drawings.

BRIEF DESCRIPTION OF THE DRAWINGS

FIG. 2B is an exemplary truth table of a data decision block according to some embodiments of the present disclosure.

FIG. 2C is an exemplary truth table of an error decision block according to some embodiments of the present disclosure.

FIG. 3A is an exemplary truth table of a data encoder according to some embodiments of the present disclosure.

FIG. 3B is an exemplary truth table of an error encoder according to some embodiments of the present disclosure.

FIG. 5A is an exemplary truth table of a data and error encoder according to some embodiments of the present disclosure.

FIG. 5B is an exemplary truth table of a mixed data and error encoder according to some embodiments of the present disclosure.

FIG. 9 is an exemplary truth table of a data and error encoder according to some embodiments of the present disclosure.

DETAILED DESCRIPTION

Figure 1:
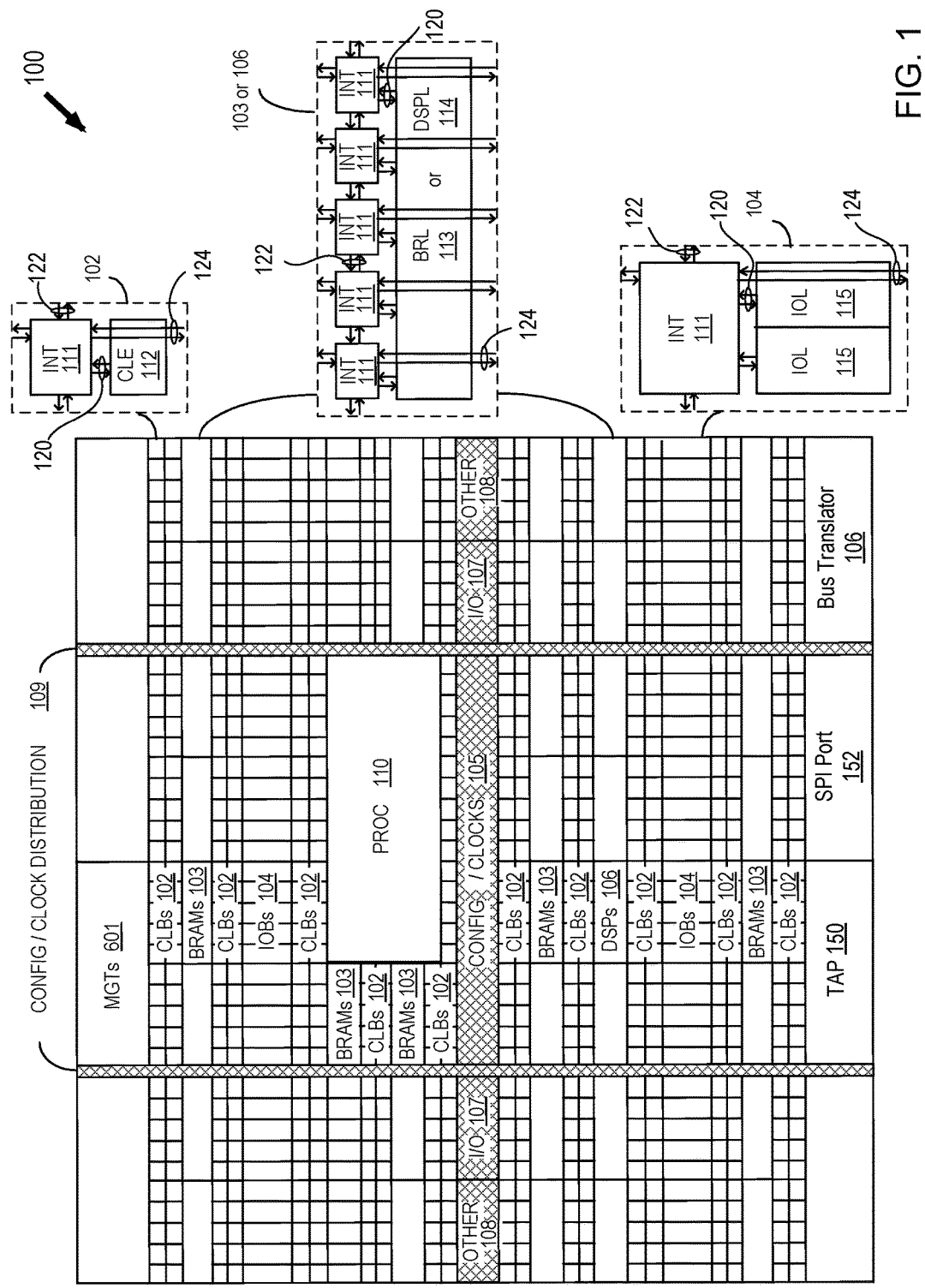
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. As demands for the speed increase, multi-bit symbols based on various encoding schemes (e.g., PAM-4) may be used to increase data rates and improve bandwidth efficiency. However, processing those multi-bit symbols may consume more power and require more area. It has been discovered that by applying various encoding schemes for processing PAM-M signals (e.g., in a deserializer of a receiver), the bits of signals representing information (both data information and error information) of the serial input signal including the multi-bit symbols may be reduced. As such, a deserializer may process fewer bits of signals in converting the serial input signal to a parallel output signal. This may improve the processing speed, lower the power usage, and reduces areas required by the deserializer.

With the above general understanding borne in mind, various embodiments for providing encoding schemes for processing PAM-M signals are described below.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or complex programmable logic devices (CPLDs). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the encoding scheme for processing the PAM-M signals (e.g., performing a serial-to-parallel conversion) is not limited to the exemplary IC depicted in FIG. 1, and that IC having other configurations, or other types of IC, may also implement the encoding scheme for processing the PAM-M signals.

Figure 2A:
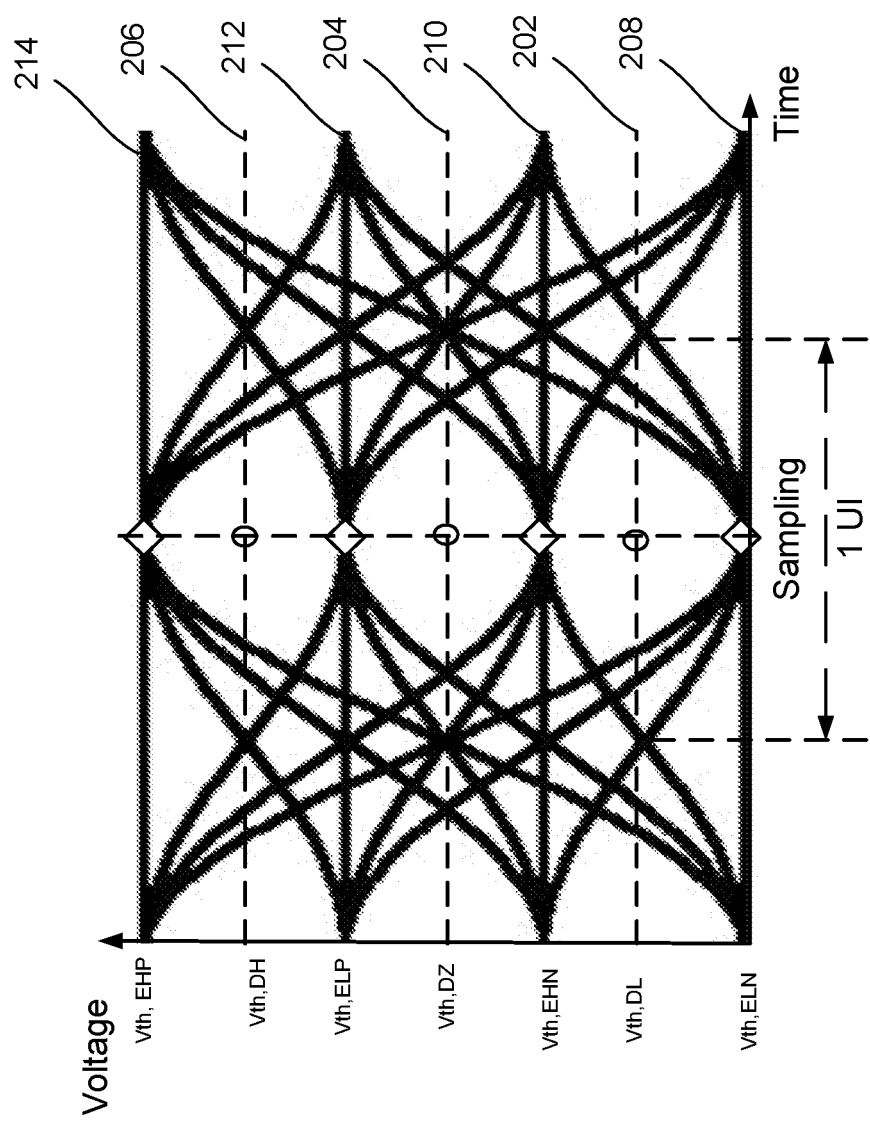
FIG. 2A is a diagram illustrating an exemplary eye diagram for PAM-4 signaling schemes according to some embodiments of the present disclosure.

Referring to FIG. 2A, illustrated therein is an eye diagram for PAM-4 signaling schemes. In a four-level signaling, such as PAM-4, the voltage on a signal conductor may take four values of increasing voltage, i.e., a first value, a second value, a third value, and a fourth value, which are referred to herein as voltage values 208, 210, 212, and 214.

Referring to FIGS. 2A and 2B, data slicers may be used to provide data information of the input signal by comparing the received voltage to different data threshold voltages. The data threshold voltage $V_{th,DL}$ 202 may be half-way between voltage values 208 and 210, the data threshold voltage $V_{th,DZ}$ 204 may be half-way between voltage values 210 and 212, and the data threshold voltage $V_{th,DH}$ 206 may be half-way between voltage values 212 and 214.

Referring to FIG. 2B, illustrated is an exemplary truth table illustrating inputs and outputs of the data slicers of a deserializer (also referred to as a serial-to-parallel converter) in a four-level receiver. When a voltage $V_{in}$ of an input to the data slicers is less than $V_{th,DL}$, all three outputs DH, DZ, and DL of the data slicers are zero. When $V_{in}$ is greater than $V_{th,DL}$ but less than $V_{th,DZ}$, outputs DH and DZ are zero while output DL is one. When $V_{in}$ is greater than $V_{th,DZ}$ but less than $V_{th,DH}$, output DH is zero, while outputs DZ and DL are one. When $V_{in}$ is greater than $V_{th,DH}$, all three outputs DH, DZ, and DL are one.

Referring to FIGS. 2A and 2C, in some embodiments, error slicers may be used to provide error information of the input signal by comparing the received voltage to different error threshold voltages. In an example, error threshold voltage $V_{th,ELN}$ has a voltage value 208, error threshold voltage $V_{th,EHN}$ has a voltage value 210, error threshold voltage $V_{th,ELP}$ has a voltage value 212, and and error threshold voltage $V_{th,EHP}$ has a voltage value 214.

Referring to FIG. 2C, illustrated is an exemplary truth table 250 illustrating inputs and outputs of the error slicers of a four-level receiver. When a voltage $V_{in}$ of an input to the error slicers is less than $V_{th,ELN}$, all four error outputs EHP, ELP, EHN, and ELN of the error slicers are zero. When the voltage $V_{in}$ is greater than $V_{th,ELN}$ but less than $V_{th,EHN}$, outputs EHP, ELP, EHN are zero while output ELN is one. When the voltage $V_{in}$ is greater than $V_{th,EHN}$ but less than $V_{th,ELP}$, outputs EHP and ELP are zero while outputs EHN and ELN are one. When the voltage $V_{in}$ is greater than $V_{th,ELP}$ but less than $V_{th,EHP}$, output EHP is zero, and outputs ELP, EHN, and ELN have a value of one. When the voltage $V_{in}$ is greater than $V_{th,EHP}$, outputs EHP, ELP, EHN, and ELN have a value of one.

Figure 4:
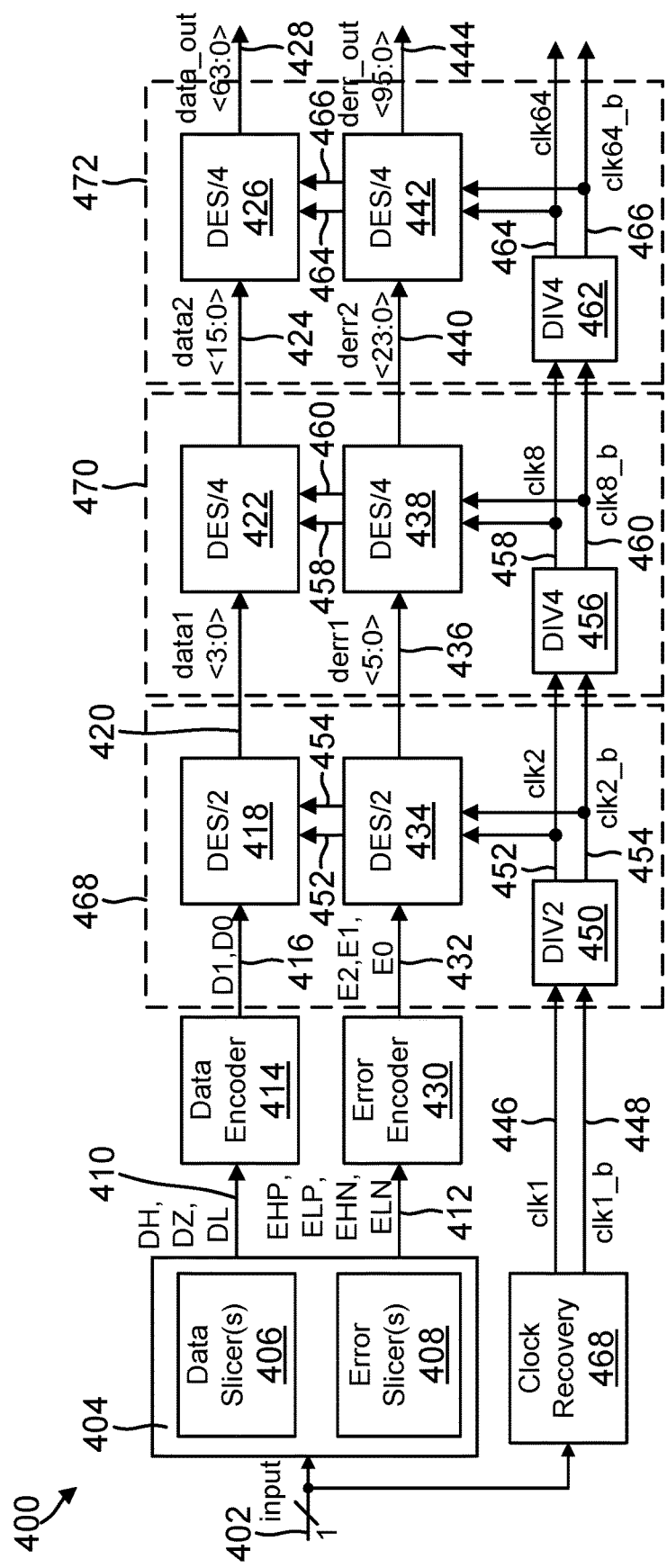
FIG. 4 is a block diagram of an exemplary deserializer according to some embodiments of the present disclosure.

Referring to FIGS. 3A, 3B, and 4, in some embodiments, the data outputs DH, DZ, and DL of data slicers and the error outputs EHP, ELP, EHN, and ELN of the error slicers are encoded independently, where separate encoders are applied to the data outputs and the error outputs. Referring to FIG. 3A, illustrated therein is an example of a truth table 300 of inputs and outputs of a data encoder, where DH, DZ, and DL are sent to the data encoder to be encoded into two bits D0 and D1. In the example illustrated in FIG. 3A, as provided by row 302 of the truth table 300, when DH, DZ, and DL are zero, both outputs D0 and D1 of the data encoder are zero. As provided by row 304 of the truth table 300, when DH and DZ are zero and DL is one, output D0 is one and output D1 is zero. As provided by row 306 of the truth table When DH is zero, and DZ and DL are one, output D0 is zero and output D1 is one. When DH, DZ, and DL are one, both outputs D0 and D1 of the data encoder are one.

Referring to FIG. 3B, illustrated therein is an example of a truth table 350 of inputs and outputs of an error encoder, where EHP, ELP, EHN, and ELN are sent to inputs of the error encoder to be encoded into three bits E0, E1, and E2 for representing error information of the input signal. In the example illustrated in FIG. 3B, row 352 provides that when EHP, ELP, EHN, and ELN are zero, all three outputs E0, E1, and E2 of the error encoder are zero. Row 354 provides that when EHP, ELP, and EHN are zero and ELN is one, the outputs E1 and E2 are zero, while the output E0 is one. Row 356 provides that when EHP and ELP are zero, and EHN and ELN are one, the outputs E2 and E0 are zero and the output E1 is one. Row 358 provides that when EHP is zero, and ELP, EHN, and ELN are one, the output E2 is zero, while the outputs E0 and E1 are one. Row 360 provides that when EHP, ELP, EHN, and ELN are one, the output E2 is one and the outputs E0 and E1 are zero. As shown in the example of FIG. 3B, rows 362, 364, and 366 of table 350 provide that not all combinations of the states of the EHP, ELP, EHN, and ELN are used because there are only five valid states of the EHP, ELP, EHN, and ELN.

Referring to the example of FIG. 4, illustrated therein is a deserializer 400 implemented according to the truth tables 200 of FIG. 2B, 250 of FIG. 2C, 300 of FIG. 3A, and 350 of FIG. 3B.

As illustrated in FIG. 4, a serial input signal 402 is provided to the deserializer 400. The serial input signal 402 may include symbols obtained from a communications channel. The serial input signal 402 may have been processed by components of a receiver, such as for linear equalization ("LE") and/or decision feedback equalization ("DFE"), prior to being input to the data and error converter 404.

In the example of FIG. 4, the data and error converter 404 includes data slicers 406 for processing the serial input signal 402 and providing an output signal 410 presenting data information of the serial input signal 402. In an example, the data slicers 406 include three slicers generating signals DH, DZ, and DL of the signal 410 respectively. In an example, the signals DH, DZ, and DL are generated according to the truth table 200 of FIG. 2B. The signal 410 including DH, DZ, and DL is sent to a data encoder 414, which processes the signal 410 and outputs a signal 416. In an example, the signal 416 includes two bits representing signals D0 and D1 respectively. In an example, the signals D0 and D1 are generated according to the truth table 300 of FIG. 3A.

In some embodiments, the signal 416 is sent to a sub-deserializer 418. The sub-deserializer 418 expands the number of parallel bits of the signal 416 by a factor of two, and outputs a 4-bit signal 420, denoted as data1<3:0>. The signal 420 is then sent to a sub-deserializer 422, which expands the number of parallel bits of the signal 420 by a factor of four, and outputs a 16-bit signal 424 denoted as data2<15:0>. The signal 424 is then sent to a sub-deserializer 426, which expands the number of parallel bits of the signal 424 by a factor of four and outputs a 64-bit signal 428, denoted as data_out<63:0>. The signal 428 is provided to an output of the deserializer 400 representing the data information of the serial input signal 402.

In the example of FIG. 4, the data and error converter 404 includes error slicers 408 for processing the serial input signal 402 and providing an output signal 412 representing error information of the serial input signal 402. The error slicers 408 may include four slicers generating signals EHP, ELP, EHN, and ELN of the signal 412 respectively. In an embodiment, the error signals EHP, ELP, EHN, and ELN are generated according to the truth table 250 of FIG. 2C. The signal 412 is sent to an error encoder 430, which outputs a signal 432 including three bits representing signals E0, E1, and E2 respectively. In an example, the signals E0, E1, and E2 are generated according to the truth table 350 of FIG. 3B.

In some embodiments, the signal 432 is sent to a sub-deserializer 434, which expands the number of parallel bits of the signal 432 by a factor of two, and outputs a 6-bit signal 436 denoted as derr1<5:0>. The signal 436 is sent to a sub-deserializer 438, which expands the number of parallel bits of the signal 436 by a factor of four, and outputs a 24-bit signal 440 denoted as derr2<23:0>. The signal 440 is sent to a sub-deserializer 442, which expands the number of parallel bits of the signal 440 by a factor of four, and outputs a 96-bit signal 444 denoted as derr_out<95:0>. The signal 444 is provided to an output of the deserializer 400 representing the error information of the serial input signal 402.

In some embodiments, the deserializer 400 includes a clock recovery circuit 474 recovering clock signals 446 and 448 (e.g., having a frequency of 32 GHz) from the serial input signal 402. In an example, the clock signals 446 and 448 are frequency-aligned to the symbol rate of the serial input signal 402, and have a clock cycle that is the same as the UI of the serial input signal 402.

In some embodiments, the clock signals 446 and 448 are sent to a clock divider 450, which outputs clock signals 452 and 454 having a frequency (e.g., 16 GHz) that is half the frequency of the clock signals 446 and 448. The sub-deserializers 434 and 418 are clocked by the clock signals 452 and 454 to generate the output signals 420 and 436.

In some embodiments, the clock signals 452 and 454 are sent to a clock divider 456, which outputs clock signals 458 and 460 having a clock frequency (e.g., 4 GHz) that is one-fourth the frequency of the clock signals 452 and 454. The sub-deserializer 422 and 438 are clocked by the clock signals 458 and 460 to generate the output signals 424 and 440.

In some embodiments, the clock signals 464 and 466 are sent to a clock divider 462, which outputs clock signals 464 and 466 having a clock frequency (e.g., 1 MHz) that is one fourth the frequency of the clock signals 458 and 460. The sub-deserializers 426 and 442 are clocked by the clock signals 464 and 466 to generate the output signals 428 and 444.

As shown in FIG. 4, in some embodiments, the power and area usages of blocks 468, 470, and 472 increase when the number of parallel bits of input signals to those blocks increase, as the blocks need to process more parallel bits of input signals. As illustrated in FIG. 4, signals 416 and 432 sent to the block 468 (including the sub-deserializers 418 and 434) have a total of five parallel bits including D0, D1, E0, E1, and D3. Signals 420 and 436 sent to the block 470 (including the sub-deserializers 422 and 438) have a total of ten parallel bits. Signals 424 and 440 sent to the block 472 (including the sub-deserializers 426 and 442) have a total of forty bits. As discussed in detail below, by reducing the total bits of the input signals representing the same information to the blocks 468, 470, and 472, power and area savings may be achieved.

Referring to FIGS. 5A, 5B, 6, 7, and 8, in some embodiments, the data signals DH, DZ, and DL and the error signals EHP, ELP, EHN, and ELN are encoded utilizing the relationship between these data signals and error signals. For example, in some embodiments, the data signals DH, DZ, and DL and the error signals EHP, ELP, EHN, and ELN are encoded in thermometer coding (unary coding). This may reduce the bits needed for representing the data information and error information of the serial input signal, resulting in power and area savings in data processing.

Referring to FIGS. 5A and 5B, illustrated are exemplary truth tables illustrating inputs and outputs of an encoder of a deserializer. Data bits DH, DZ, and DL and error bits EHP, ELP, EHN, and ELN are sent to inputs of the encoder, which outputs three bits D1, D0, and DE. As shown in FIG. 5A, rows 502, 504, 506, 508, 510, 512, 514, and 516 of the truth table 500 correspond to all eight valid states of the seven bits EHP, ELP, EHN, ELN, DH, DZ, and DL. As such, three output bits of the encoder are sufficient to represent these eight valid states. Illustrated in FIG. 5A is an example of using three bits output D1, D0, and DE of the encoder to represent the eight states. In various embodiments, the encoding scheme may be further simplified to provide power/area savings in data processing. As shown in the truth table 500, rows 502 and 504 provide that the output DE representing the error information is equivalent to the error bit ELN when D1 and D0 both have a value of zero. Rows 506 and 508 provide that the output DE is equivalent to the error bit EHN when D1 is zero and D0 is one. Rows 510 and 512 provide that the output bit DE is equivalent to the error bit ELP when D1 has a value of one and D0 has a value of zero. Rows 514 and 516 provide that the output bit DE is equivalent to the error bit EHP when both data bits D0 and D1 have a value of one. This representation is summarized in the truth table 550 of FIG. 5B.

Figure 6:
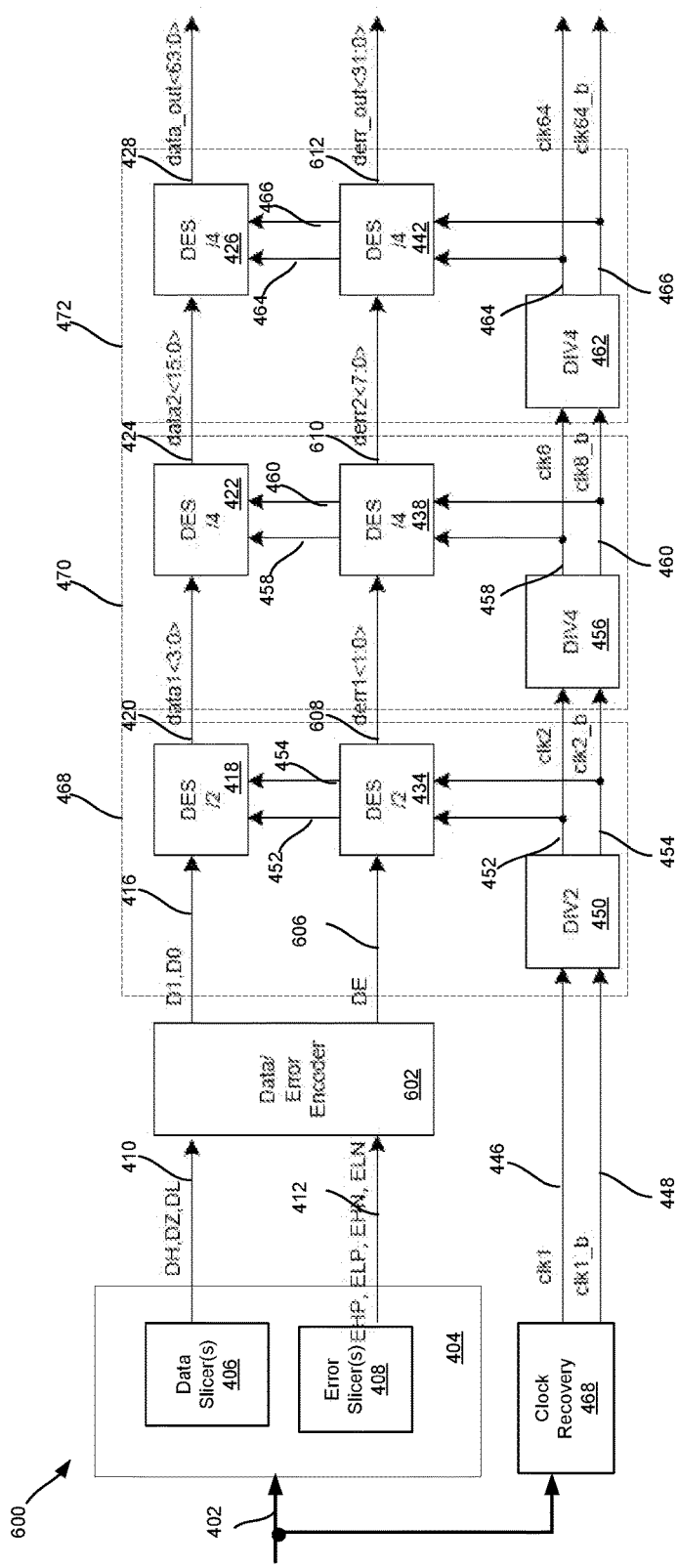
FIG. 6 is a block diagram of an exemplary deserializer according to some embodiments of the present disclosure.

Referring to FIG. 6, illustrated therein is a deserializer 600 including an encoder 602 implemented according to the truth tables 500 of FIG. 5A and 550 of FIG. 5B. The deserializer 600 is substantially similar to the deserializer 400 of FIG. 4 except for the differences described below. In the deserializer 600, using the encoder 602 implemented according to the truth tables 500 of FIG. 5A and 550 of FIG. 5B, the number of bits required to represent both the data information and the error information of the serial input signal 402 are reduced (e.g., by 40%), resulting in power and area savings in data processing.

In the deserializer 600 illustrated in FIG. 6, the output 410 of the data slicers 406 including signals DH, DZ, and DL representing the data information of the serial input signal 402. The output 412 of the error slicers 408 includes signals EHP, ELP, EHN, and ELN representing the error information of the serial input signal 402. The signals 410 and 412 are sent to the encoder 602, which outputs a signal 416 including data signals D0 and D1, and a 1-bit error signal 606 including an error signal DE. In an example, the data signals D0 and D1 and error signal DE are generated according to the truth table 550 of FIG. 5B.

In the example of FIG. 6, using the data signals D0 and D1, sub-deserializers 418, 422, and 426 generate a 64-bit data output 428 representing the data information of the serial input signal 402, also denoted as data_out<63:0>.

In some embodiments, the 1-bit error signal 606 is sent to a sub-deserializer 434, which expands the number of parallel bits of the signal 606 by a factor of two, and outputs a 2-bit signal 608 denoted as derr1<1:0>. The signal 608 is sent to a sub-deserializer 438, which expands the number of parallel bits of the signal 608 by a factor of four, and outputs an 8-bit signal 610 denoted as derr2<7:0>. The signal 610 is sent to a sub-deserializer 442, which expands the number of parallel bits of the signal 610 by a factor of four, and outputs a 32-bit signal 612 denoted as derr_out<31:0>. The signal 612 is provided to an output of the deserializer 600 representing the error information of the serial input signal 402.

As shown in FIG. 6, by using the encoder 602, total bits of the input signals to the blocks 468, 470, and 472 are reduced by 40% comparing to the deserializer 400 of FIG. 4, resulting in power and area savings of about 40%. For example, signals 416 and 606 sent to the block 468 (including the sub-deserializers 418 and 434) have a total of three bits including D0, D1, and DE. Signals 420 and 608 sent to the block 470 (including the sub-deserializers 422 and 438) have a total of six bits. Signals 424 and 440 sent to the block 472 (including the sub-deserializers 426 and 442) have a total of 24 bits.

Figure 7:
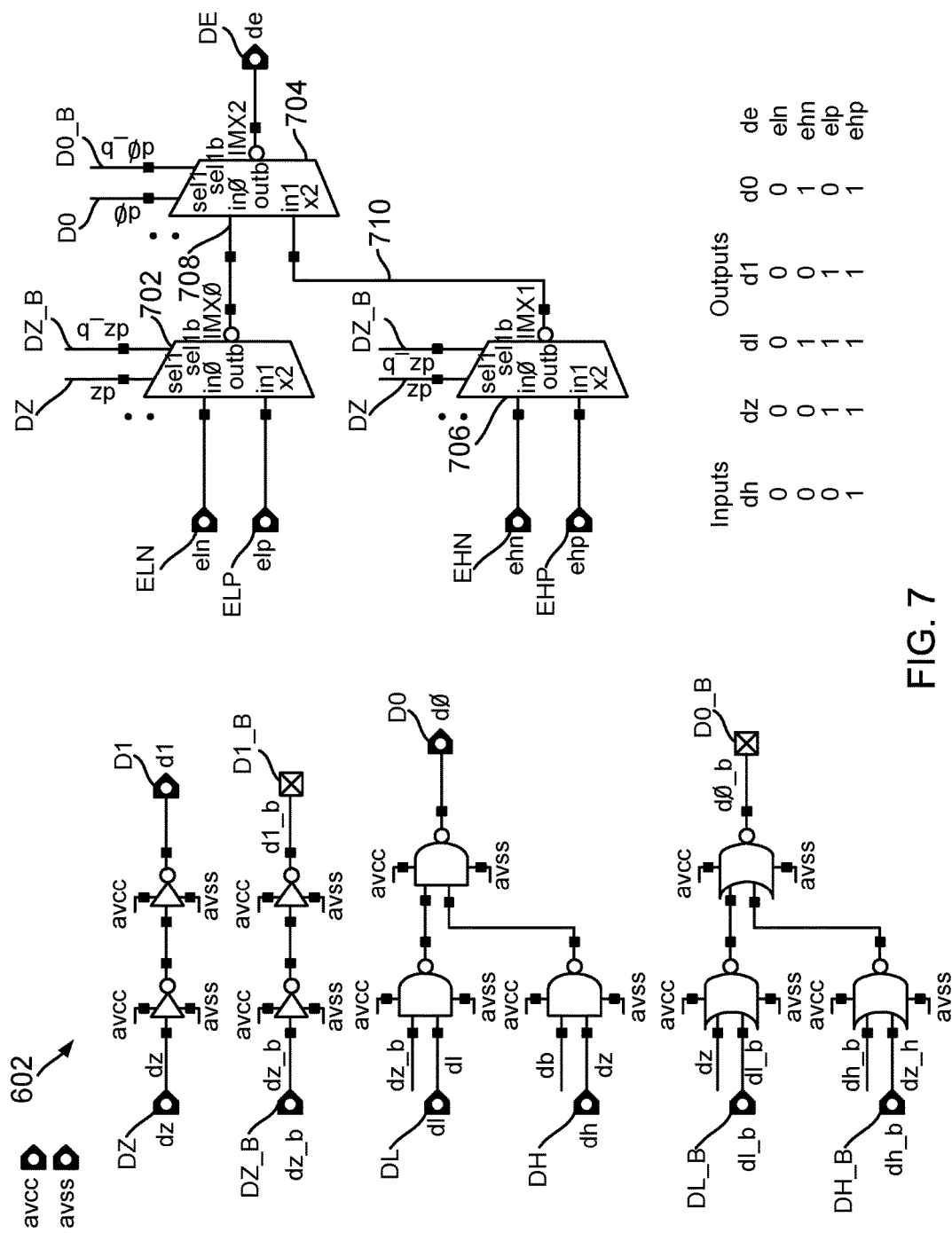
FIG. 7 is a block diagram of an exemplary mixed data and error encoder according to some embodiments of the present disclosure.

Referring to the example of FIG. 7, illustrated is an exemplary data/error encoder 602 implemented according to the truth table 550 of FIG. 5B. Specifically, values of the outputs D0, D1, and DE and the inputs DZ, DL, DH, ELN, ELP, EHN, EHP of the encoder 602 satisfy the truth table 550 of FIG. 5B. As discussed above with reference to FIG. 4, in the deserializer 400, the data information represented by signals DH, DZ, and DL and the error information represented by signals EHP, ELP, EHN, and ELN are encoded separately by the data encoder 414 and error encoder 430. Unlike the separate data encoder 414 and error encoder 430 of the deserializer 400, an encoder 602 of the deserializer 600 may encode the data information based on the error information, and/or encode the error information based on the data information. As such, the encoder 602 is also referred to as a mixed data and error encoder 602, mixed encoder 602, or data/error encoder 602. By using the mixed data and error encoder 602, the data information and error information of the serial input signal 402 may be presented using fewer bits.

In the example of FIG. 7, the data information represented by signals DZ, DL, and DH is encoded to data signals DL and DH without using the error information. For example, the signal DZ is provided to an input of the encoder 602 to generate an output D1, and the signals DL and DH are provided to inputs of the encoder 602 to provide an output D0. In some examples, the encoder 602 receives complementary signals DZ_B, DL_B, and DH_B of the signals DZ, DL, and DH respectively, and provides outputs D0_B and D1_B, which are complementary signals of D0 and D1 respectively.

In the example of FIG. 7, the error information represented by signals ELN, ELP, EHN, and EHP is encoded to an error signal DE based on the data information. As illustrated in FIG. 7, a plurality of multiplexers 702, 704, and 706 are used to generate an output DE according to the truth table 550 of FIG. 5B. A multiplexer 702 receives error signals ELN and ELP at its inputs, and uses signals DZ and DZ_B as select lines to provide a signal 708. A multiplexer 706 receives error signals EHN and EHP at its inputs, and uses signals DZ and DZ_B as select lines to provide an output 710. Signals 708 and 710 are then sent to inputs of a multiplexer 704, which uses signals D0 and D0_B as select lines to provide an error signal DE at its output. As such, the data information and error information of the serial input signal 402 are presented using three bits D0, D1, and DE.

Figure 8:
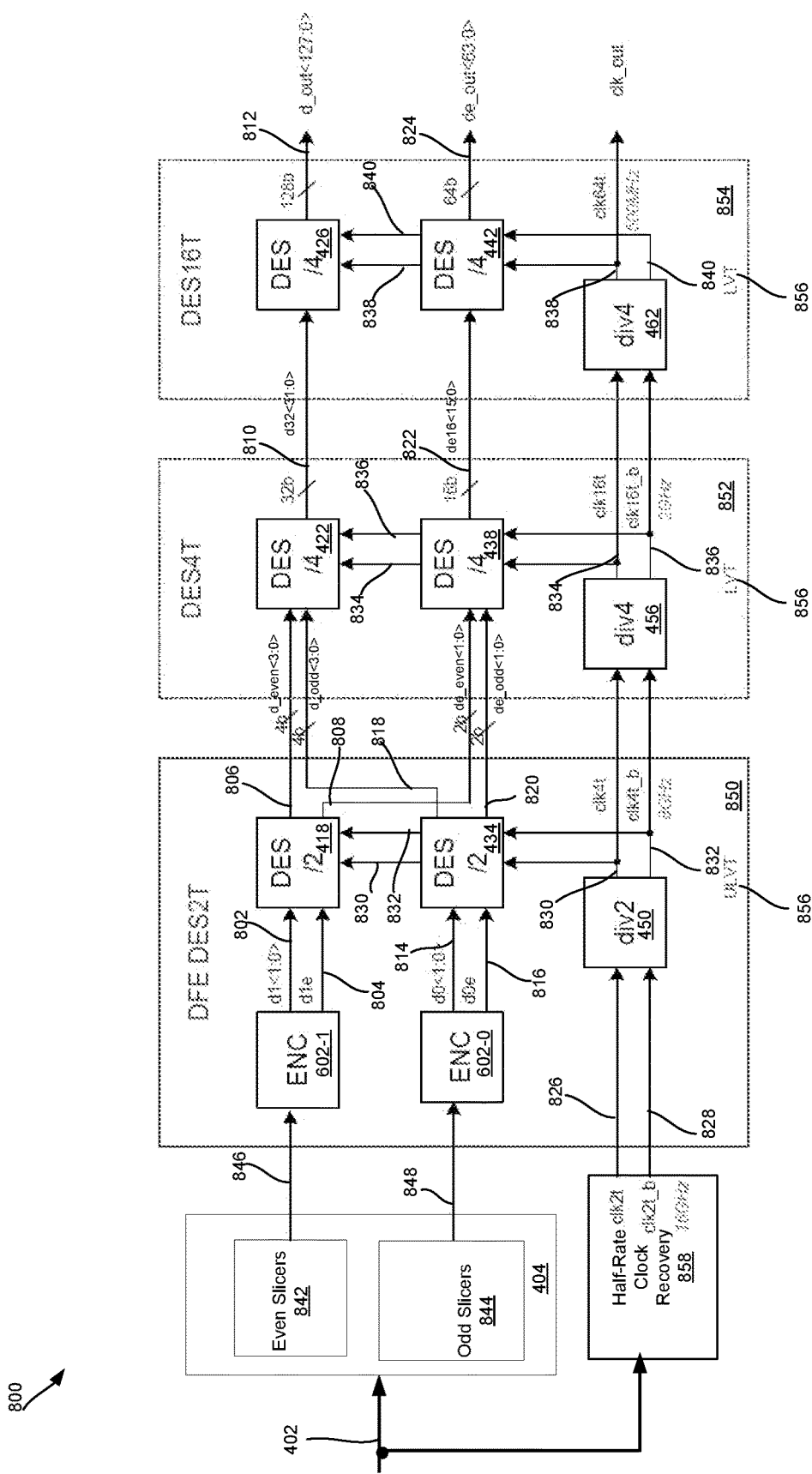
FIG. 8 is a block diagram of an exemplary deserializer according to some embodiments of the present disclosure.

Referring to FIG. 8, an exemplary half-rate deserializer 800 implemented using the encoder 602 of FIG. 7 is illustrated. The half-rate deserializer 800 is substantially similar to the deserializer 600 of FIG. 6 except for the differences described below. In the example of FIG. 8, the data and error converter 404 includes even data and error slicers 842 (also referred to as even slicers 842) and odd data and error slicers 844 (also referred to as odd slicers 844). In an example, the even data and error slicers 842 includes three data slicers (for generating signals DH1, DZ1, and DL1 respectively) and four error slicers (for generating signals EHP1, ELP1, EHN1, and ELN1 respectively), and sample the input data 402 from its even data path for each period of a sampling clock, and output a signal 846. In an embodiment, the signal 846 has seven bits for signals DH1, DZ1, DL1, EHP1, ELP1, EHN1, and ELN1 representing data and error information of the even data path of the serial input signal 402. In an embodiment, the odd slicers 844 includes three data slicers (for generating signals DH0, DZ0, and DL0 respectively) and four error slicers (for generating signals EHP0, ELP0, EHN0, and ELN0 respectively), sample the input data 402 from its odd data path for each period of the sampling clock, and output a signal 848. In an embodiment, the signal 848 has seven bits for signals DH0, DZ0, DL0, EHP0, ELP0, EHN0, and ELN0 representing data and error information of the odd data path of the input data signal 402. The sampling clock is a half-rate clock with a clock cycle of 2*UI. In an example, the sampling clock has a frequency of 16 GHz.

In the example of FIG. 8, the signal 846 is sent to an even encoder 602-1 substantially similar to the encoder 602 of FIG. 7. The even encoder 602-1 processes the signal 846 to provide a data signal 802 and an error signal 804. The data signal 802 represents the data information of the even data path of the serial input signal 402, includes two bits representing D1 and D0 respectively, and is noted as d1<1:0>. The error signal 804 represents the error information of the even data path of the serial input signal 402, includes one bit representing DE, and is noted as d1e.

In the example of FIG. 8, the signal 846 is sent to an even encoder 602-1 substantially similar to the encoder 602 of FIG. 7. The even encoder 602-1 processes the signal 846 to output a data signal 802 and an error signal 804. The data signal 802 represents the data information of the even data path of the serial input signal 402, includes two bits representing D1 and D0 respectively, and is noted as d1<1:0>. The error signal 804 represents the error information of the even data path of the serial input signal 402, includes one bit representing DE, and is noted as d1e.

In the example of FIG. 8, the signal 848 is sent to an odd encoder 602-0 substantially similar to the encoder 602 of FIG. 7. The odd encoder 602-0 processes the signal 848 to output a data signal 814 and an error signal 816. The data signal 814 represents the data information of the odd data path of the serial input signal 402, includes two bits representing D1 and D0 respectively, and is noted as d0<1:0>. The error signal 816 represents the error information of the odd data path of the serial input signal 402, includes one bit representing DE, and is noted as d0e.

In some embodiments, for the even data path, the signals 802 and 804 are sent to a sub-deserializer 418, which expands the number of parallel bits of the signals 802 and 804 by a factor of two. The sub-deserializer 418 outputs a 4-bit signal 806 corresponding to the signal 802, denoted as d_even<3:0>, and a 2-bit signal 808 corresponding to the signal 804, denoted as de_even<1:0>. Similarly, for the odd data path, the signals 814 and 816 are sent to a sub-deserializer 434, which expands the number of parallel bits of the signals 814 and 816 by a factor of two. The sub-deserializer 434 outputs a 4-bit signal 818 corresponding to the signal 814, denoted as d_odd<3:0>, and a 2-bit signal 820 corresponding to the signal 816, denoted as de_odd<1:0>.

In some embodiments, the signals 806 and 818 representing the data information of the even data path and odd data path respectively are sent to a sub-deserializer 422. The sub-deserializer 422 aligns the signals 806 and 818, expands the number of parallel bits of the signals 806 and 818 by a factor of four, and outputs a 32-bit signal 810 (denoted d32<31:0>) representing the data information of the serial input signal 402 (including both even and odd data paths).

In some embodiments, the signals 808 and 820 representing the error information of the even data path and odd data path respectively are sent to a sub-deserializer 438. The sub-deserializer 438 aligns the signals 808 and 820, expands the number of parallel bits of the signals 808 and 820 by a factor of four, and outputs a 16-bit signal 822 (denoted as de16<15:0>) representing the error information of the serial input signal 402 (including both even and odd data paths).

In some embodiments, the signal 810 is sent to a sub-deserializer 426, which expands the number of parallel bits of the signal 810 by a factor of four, and outputs a 128-bit signal 812 denoted as d_out<127:0>. The signal 812 is provided to an output of the deserializer 800 representing the data information of the serial input signal 402.

In some embodiments, the signal 822 is sent to a sub-deserializer 442, which expands the number of parallel bits of the signal 822 by a factor of four, and outputs a 64-bit signal 824 denoted as de_out<63:0>. The signal 824 is provided to an output of the deserializer 800 representing the error information of the serial input signal 402.

In some embodiments, the deserializer 800 is implemented using devices 850, 852, and 854 having different voltage thresholds 856. For example, the device 850 is an ultra-low-voltage-threshold (ULVT) device. For further example, the devices 852 and 854 are low-voltage-threshold (LVT) devices having voltage thresholds lower than that of the device 850.

In some embodiments, the deserializer 800 includes half-rate clock recovery circuit 858 recovering clock signals 826 and 828 (e.g., having a frequency of 16 GHz) from the serial input signal 402. In an example, the clock signals 826 and 828 have a clock cycle that is 2*UI. In an embodiment, the clock signals 826 and 828 are sent to the data and error converter 404, and the even slicers 842 and odd slicers 844 are clocked by the clock signals 826 and 828 to generate the signals 846 and 848.

In some embodiments, the clock signals 826 and 828 are sent to a clock divider 450, which outputs clock signals 830 and 832 having a frequency (e.g., 8 GHz) that is half the frequency of the clock signals 826 and 828. The sub-deserializers 434 and 418 are clocked by the clock signals 830 and 832 to generate the output signals 420 and 436.

In some embodiments, the clock signals 830 and 832 are sent to a clock divider 456, which outputs clock signals 834 and 836 having a clock frequency (e.g., 2 GHz) that is one-fourth the frequency of the clock signals 830 and 832. The sub-deserializers 422 and 438 are clocked by the clock signals 834 and 836 to generate the output signals 424 and 440.

In some embodiments, the clock signals 834 and 836 are sent to a clock divider 462, which generates clock signals 838 and 840 having a clock frequency (e.g., 500 MHz) that is one fourth the frequency of the clock signals 834 and 836. The sub-deserializer 426 and 442 are clocked by the clock signals 838 and 840 to generate the signals 812 and 824.

It is noted that various configurations (e.g., encoding scheme applied to the serial input signal, the data and error threshold voltages, truth tables of inputs and outputs of the slicers, truth tables of inputs and outputs of encoders, configurations of the deserializers) illustrated in FIGS. 2A-9 are exemplary only and not intended to be limiting beyond what is specifically recited in the claims that follow. It will be understood by those skilled in that art that other configurations may be used.

While the serial input signal illustrated in FIGS. 2-8 is a PAM-4 signal, it will be understood the input serial signals may be PAM-M signals where M is an integer having a value (e.g., 3, 5, 6) different from 4 without departing from the scope of the present disclosure. Referring to FIG. 9, illustrated is an exemplary truth table 900 illustrating inputs and outputs of an encoder of a deserializer for a PAM-6 signal. Data bits DH2, DH, DZ, DL, and DL2 and error bits EHP2, EHP, ELP, EHN, ELN, and ELN2 are sent to inputs of the encoder, which outputs four bits D2, D1, D0, and DE. The truth table 900 includes twelve rows corresponding to all twelve valid states of the eleven input bits. As such, four output bits of the encoder are sufficient to represent these twelve valid states. Illustrated in FIG. 9 is an example of using four output bits D2, D1, D0, and DE of the encoder to represent the twelve states. In various embodiments, the encoding scheme may be further simplified to provide power/area savings in data processing. As shown in table 900, the output DE representing the error information is equivalent to the error bit ELN2 when D2, D1, and D0 have a value of zero, is equivalent to the error bit ELN when D2 and D1 are zero and D0 is one. The output DE is equivalent to the error bit EHN when D2 and D0 are zero and D1 is one, and is equivalent to the error bit ELP when D2 is zero, and D1 and D2 are one. The output bit DE is equivalent to the error bit EHP when D2 is one, and D1 and D0 are zero, and is equivalent to the error bit EHP2 when D2 and D0 are one, and D1 is zero.

Various advantages may be present in various applications of the present disclosure. No particular advantage is required for all embodiments, and different embodiments may offer different advantages. One of the advantages in some embodiments is that a mixed data and error encoder is used to reduce the bits of signals representing information (including data information and error information) of the serial input signal. As such, a deserializer may process fewer bits of signals in converting the serial input signal to a parallel output signal. This may improve the processing speed, lower the power usage, and reduces areas required by the deserializer. In an example, the mixed data and error encoder utilizes the relationship between the data signals (e.g., DH, DZ, DL) and the error signals (e.g., EHP, ELP, EHN, ELN), and determines a number of valid states (e.g., eight) of a combination of the data signals and the error signals. The number of bits (e.g., three) of the encoder output may be chosen based on the least bits for representing these valid states.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. An integrated circuit (IC) comprising:
  a serial-to-parallel converter configured to receive a serial input signal to provide one or more parallel output signals, wherein the serial input signal is an M-level Pulse-Amplitude Modulated (PAM) signal, wherein M is a positive integer, and wherein the serial-to-parallel converter includes:
    a data converter configured to:
      receive the serial input signal; and
      provide a data converter output signal, wherein the data converter output signal represents information of the serial input signal with N1 bits, wherein N1 is a positive integer;
    an encoder configured to encode the data converter output signal to provide encoder output signal with N2 bits, wherein N2 is a positive integer less than half of N1; and
    one or more sub-deserializers configured to:
      receive the encoder output signal and generate the one or more parallel output signals.

2. The IC of claim 1, wherein the data converter is configured to:
  represent data information of the serial input signal using a first number of bits of the data converter output signal; and
  represent error information of the serial input signal using a second number of bits of the data converter output signal, wherein the second number is greater than the first number.

3. The IC of claim 2, wherein the encoder is configured to:
  represent data information of the serial input signal using a third number of parallel bits of the encoder output signal; and
  represent error information of the serial input signal using a fourth number of parallel bits of the encoder output signal, wherein the fourth number is less than the third number.

4. The IC of claim 3, wherein the serial input signal is a PAM-4 signal, and wherein M equals to four, N1 equals to seven, and N2 equals to three.

5. The IC of claim 4, wherein the first number equals to three, the second number equals to four, the third number equals to two, and the fourth number equals to one.

6. The IC of claim 3, wherein the one or more parallel output signals includes:
   a data output signal representing the data information of the serial input signal, and
   an error output signal representing the error information of the serial input signal, and
   wherein a first ratio of a number of parallel bits of the data output signal to a number of parallel bits of the error output signal equals a second ration of the third number to the fourth number.

7. The IC of claim 1, wherein the data converter includes:
   even slicers configured to provide an even data converter output signal, wherein the even data converter output signal represents information of the serial input signal in an even data path; and
   odd slicers configured to provide an odd data converter output signal, wherein the odd data converter output signal represents information of the serial input signal in an odd data path.

8. The IC of claim 7, further comprising:
   an even encoder configured to:
      receive the even data converted output signal;
      provide a data even encoder output signal representing data information of the serial input signal in the even data path; and
      provide an error even encoder output signal representing error information of the serial input signal in the even data path; and
   an odd encoder configured to:
      receive the odd data converted output signal;
      provide a data odd encoder output signal representing data information of the serial input signal in the odd data path; and
      provide an error odd encoder output signal representing error information of the serial input signal in the odd data path.

9. The IC of claim 8, further comprising:
   a first sub-deserializer and a second sub-deserializer clocked by a first clock, wherein the first sub-deserializer is configured to:
      receive the data even encoder output signal and the error even encoder output signal;
      provide a first sub-deserializer output signal representing the data information in the even data path; and
      provide a second sub-deserializer output signal representing the error information in the even data path; and
   where the second sub-deserializer is configured to:
      receive the data odd encoder output signal and the error odd encoder output signal;
      provide a third sub-deserializer output signal representing the data information in the odd data path; and
      provide a fourth sub-deserializer output signal representing the error information in the odd data path.

10. The IC of claim 9, further comprising:
   a third sub-deserializer and a fourth sub-deserializer clocked by a second clock having a clock cycle greater than that of the first clock, wherein the third sub-deserializer is configured to:
      receive the first sub-deserializer output signal of the first sub-deserializer and the third sub-deserializer output signal of the second sub-deserializer; and
      provide a fifth sub-deserializer output signal representing the data information of the serial input signal; and
   wherein the fourth sub-deserializer is configured to:
      receive the second sub-deserializer output signal of the first sub-deserializer and the fourth sub-deserializer output signal of the second sub-deserializer; and
      provide a sixth sub-deserializer output signal representing the error information of the serial input signal.

11. A method, comprising:
   receiving a serial input signal, wherein the serial input signal is an M-level Pulse-Amplitude Modulated (PAM) signal, wherein M is a positive integer;
   providing a data converter output signal representing information of the serial input signal with N1 bits, wherein N1 is a positive integer;
   encoding the N1 bits of the data converter output signal to provide an encoder output signal with N2 bits, wherein N2 is a positive integer less than half of N1;
   expanding parallel bits of the encoder output signal to provide one or more parallel output signals.

12. The method of claim 11, wherein the providing the data converter output signal representing information of the serial input signal includes:
   representing data information of the serial input signal using a first number of bits of the data converter output signal; and
   representing error information of the serial input signal using a second number of bits of the data converter output signal, wherein the second number is greater than the first number.

13. The method of claim 12, wherein the encoding the data converter output signal to provide an encoder output includes:
   representing data information of the serial input signal using a third number of parallel bits of the encoder output signal; and
   representing error information of the serial input signal using a fourth number of parallel bits of the encoder output signal, wherein the fourth number is less than the third number.

14. The method of claim 13, wherein the serial input signal is a PAM-4 signal, and
   wherein M equals to four, N1 equals to seven, and N2 equals to three.

15. The method of claim 14, wherein the first number equals to three, the second number equals to four, the third number equals to two, and the fourth number equals to one.

16. The method of claim 13, wherein the one or more parallel output signals includes:
   a data output signal representing the data information of the serial input signal, and
   an error output signal representing the error information of the serial input signal, and
   wherein a first ratio of a number of parallel bits of the data output signal to a number of parallel bits of the error output signal equals a second ration of the third number to the fourth number.

17. The method of claim 11, wherein the providing the data converter output signal representing information of the serial input signal includes:
   providing an even data converter output signal, wherein the even data converter output signal represents information of the serial input signal in an even data path; and providing an odd data converter output signal, wherein the odd data converter output signal represents information of the serial input signal in an odd data path.

18. The method of claim 17, further comprising:

encoding the even data converted output signal to:
- provide a data even encoder output signal representing data information of the serial input signal in the even data path; and
- provide an error even encoder output signal representing error information of the serial input signal in the even data path; and encoding the odd data converted output signal to:
- provide a data odd encoder output signal representing data information of the serial input signal in the odd data path; and
- provide an error odd encoder output signal representing error information of the serial input signal in the odd data path.

19. The method of claim 18, further comprising:

clocking a first sub-deserializer and a second sub-deserializer clocked using a first clock;

sending the data even encoder output signal and the error even encoder output signal to a first sub-deserializer;

providing a first sub-deserializer output signal representing the data information in the even data path;

providing a second sub-deserializer output signal representing the error information in the even data path;

sending the data odd encoder output signal and the error odd encoder output signal;

providing a third sub-deserializer output signal representing the data information in the odd data path; and providing a fourth sub-deserializer output signal representing the error information in the odd data path.

20. The method of claim 19, further comprising:

clocking a third sub-deserializer and a fourth sub-deserializer clocked by a second clock having a clock cycle greater than that of the first clock;

sending the first sub-deserializer output signal of the first sub-deserializer and the third sub-deserializer output signal of the second sub-deserializer to the third sub-deserializer;

providing a fifth sub-deserializer output signal representing the data information of the serial input signal;

sending the second sub-deserializer output signal of the first sub-deserializer and the fourth sub-deserializer output signal of the second sub-deserializer to the fourth sub-deserializer; and providing a sixth sub-deserializer output signal representing the error information of the serial input signal.

\* \* \* \* \*